United States Patent
Galbis et al.

(12)

(10) Patent No.: US 8,994,347 B2
(45) Date of Patent: Mar. 31, 2015

(54) ASSISTING A LOAD CURRENT OF A SWITCHING VOLTAGE REGULATOR

(75) Inventors: Pablo Moreno Galbis, Palo Alto, CA (US); James E. C. Brown, San Jose, CA (US)

(73) Assignee: R2 Semiconductor, Inc., Sunnyvale, CA (US)

( * ) Notice: Subject to any disclaimer, the term of this patent is extended or adjusted under 35 U.S.C. 154(b) by 291 days.

(21) Appl. No.: 13/488,268

(22) Filed: Jun. 4, 2012

(65) Prior Publication Data
US 2013/0321076 A1 Dec. 5, 2013

(51) Int. Cl.
| | |
|---|---|
| G05F 1/00 | (2006.01) |
| H03F 1/02 | (2006.01) |
| H03F 3/195 | (2006.01) |
| H03F 3/24 | (2006.01) |
| H02M 3/158 | (2006.01) |
| H02M 3/156 | (2006.01) |

(52) U.S. Cl.
CPC ............. H03F 1/0216 (2013.01); H03F 3/195 (2013.01); H03F 3/24 (2013.01); *H03F 2200/555* (2013.01); H02M 3/158 (2013.01); *H02M 2003/1566* (2013.01)
USPC ....................................................... 323/271

(58) Field of Classification Search
CPC ... H02M 3/156; H02M 3/158; H02M 3/1588; H02M 2003/1566; H02M 2001/0009; H02M 2001/0045; H02M 1/40; H03F 1/0216; H03F 3/24; H03F 2/195
USPC ................. 323/222–225, 268–269, 271–274, 323/282–285, 351
See application file for complete search history.

(56) References Cited

U.S. PATENT DOCUMENTS

| | | | | |
|---|---|---|---|---|
| 5,612,597 | A | * | 3/1997 | Wood ............................ 315/293 |
| 5,905,407 | A |   | 5/1999 | Midya |
| 5,998,977 | A | * | 12/1999 | Hsu et al. ...................... 323/272 |
| 6,150,798 | A |   | 11/2000 | Ferry et al. |
| 6,229,289 | B1 |   | 5/2001 | Piovaccari et al. |
| 6,472,854 | B2 | * | 10/2002 | Ootani ........................ 323/272 |
| 6,583,664 | B2 |   | 6/2003 | Mathe et al. |
| 6,636,023 | B1 |   | 10/2003 | Amin |
| 6,661,211 | B1 |   | 12/2003 | Currelly et al. |
| 7,190,150 | B2 |   | 3/2007 | Chen et al. |
| 7,292,015 | B2 |   | 11/2007 | Oswald et al. |
| 7,342,387 | B1 |   | 3/2008 | Li |

(Continued)

OTHER PUBLICATIONS

Blanken et. al., "A 50 MHz Bandwidth Multi-Mode PA Supply Modulator for GSM, EDGE, and UMTS Application" IEEE RFIC 2008 paper RTU1C-1.

(Continued)

*Primary Examiner* — Timothy J Dole
*Assistant Examiner* — Ivan Laboy Andino
(74) *Attorney, Agent, or Firm* — Brian R. Short (57) ABSTRACT

Embodiments for at methods, apparatus and systems for operating a voltage regulator are disclosed. One method includes generating, by a switching controller, a switching voltage through controlled closing and opening of a series switch element and a shunt switch element, and generating an output voltage by filtering the switching voltage with an output inductor and a load capacitor. The method further includes generating an assisting current based on a value of current conducted through the output inductor, and assisting the load current by summing the assisting current with the current conducted through the inductor.

14 Claims, 7 Drawing Sheets

(56) References Cited

U.S. PATENT DOCUMENTS

| | | | |
|---|---|---|---|
| 7,782,030 B2* | 8/2010 | Ryu et al. | 323/268 |
| 8,054,058 B2 | 11/2011 | Liu et al. | |
| 8,384,367 B2* | 2/2013 | Murakami et al. | 323/285 |
| 8,587,268 B1* | 11/2013 | Huard | 323/268 |
| 2006/0001410 A1* | 1/2006 | Ishikawa et al. | 323/282 |
| 2006/0192536 A1* | 8/2006 | Chen et al. | 323/222 |
| 2008/0252380 A1 | 10/2008 | Blanken et al. | |
| 2010/0134078 A1* | 6/2010 | Murakami et al. | 323/271 |
| 2013/0193941 A1* | 8/2013 | DeFazio | 323/282 |

OTHER PUBLICATIONS

Barrado et. al., "New DC/DC Converter with Low Output Voltage and Fast Transient Response" APEC 2003.

Consoli et. al., "A New VRM Topology for Next Generation Microprocessors", PESC 2001.

Ertl et. al., "Basic Considerations and Topologies of Switched-Mode Assisted Linear Power Amplifiers", IEEE Trans Ind Elect v 44 p. 116 (1997).

Jegandren et. al., "Voltage Injection Switching Inductor (VISI) Method for Fast Transient Response in Switch Mode Power Supplies", 2nd International Conference on Power and Energy, Johor Baharu, Malaysia (2008).

Liu et. al., "A Fast Transient Recovery Module for DC-DC Converters", IEEE Trans Industrial Elect v 56 p. 2522 (2009).

Martinez et. al., "Linear-Assisted DC-DC Converter Based on CMOS Technology", PESC 2008 p. 3735.

Senanayake et. al., "High-Current Clamp for Fast-Response Load Transitions of DC-DC Converter", APEC 2003.

Wang et. al., "VR Transient Improvement at High Slew Rate Load—Active Transient Voltage Compensator", IEEE Trans Power Elect v 22 p. 1472 (2007).

Wang. et. al., "A Monolithic High-Efficiency 2.4-GHz 20-dBm SiGe BiCMOS Envelope-Tracking OFDM Power Amplifier", IEEE J. Solid-State Ckts v 42 #6 p. 1271 (2007).

Zhang et. al., "Controlled slew rate enhancement circuit for error amplifier in high frequency DC-DC converters", IEEE Asia Pacific Conference on Circuits and Systems (APCCAS) 2008 p. 1852.

* cited by examiner

ASSISTING A LOAD CURRENT OF A SWITCHING VOLTAGE REGULATOR

FIELD OF THE DESCRIBED EMBODIMENTS

The described embodiments relate generally to power conversion. More particularly, the described embodiments relate to systems, methods and apparatus for assisting a load current of a switching voltage regulator.

BACKGROUND

Figure 1:
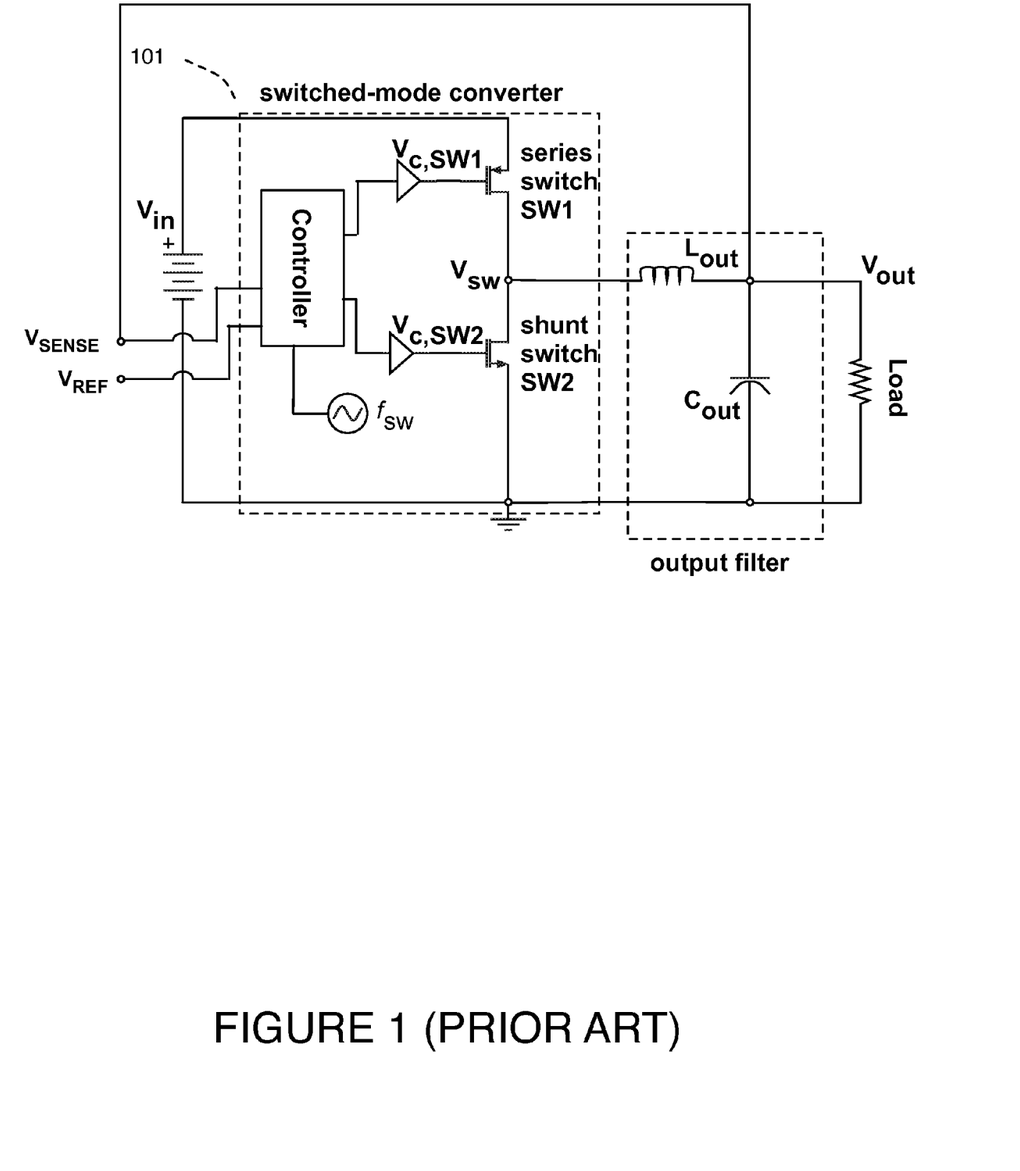
FIG. 1 shows an example of a prior art voltage regulator.

Switched-mode power converters are widely used to convert between differing DC voltages. FIG. 1 shows an example of a typical buck converter (used to provide a reduced voltage from a higher-voltage supply).

Transistor switches are used to alternately connect an inductor to a supply voltage and a ground, at a switching frequency $f_{sw}$. The output of the inductor is connected to a capacitor and resistive load. The output voltage is connected to the terminal $V_{SENSE}$, allowing closed-loop feedback control thereof. The target output voltage may be intentionally varied, as discussed in more detail below. In FIG. 1, a terminal $V_{REF}$ is depicted, which may be used to provide an analog voltage used to control $V_{OUT}$.

Most DC-DC converter applications must support changes in load current (load transients). Some applications also require rapid changes in output voltage. In certain specialized applications, both rapid changes in output voltage and current are required, and further, the relative timing of these changes is constrained to support specific requirements of the load. For example, a mobile device may use the Global System for Mobile Communications (GSM) protocol to communicate with a base station. GSM uses time-division multiplexing, wherein each mobile device is allocated one or more time slots, during which it is the only mobile device transmitting on a given channel. In a default operating condition, used, for example, for voice communication, a mobile device is assigned one of eight possible time slots in which to transmit, and a constant-envelope phase modulation (Gaussian Minimum Shift Keying, or GMSK) is used. Data communications configurations, in which a linear modulation is employed, may use up to four consecutive timeslots. Further, it is also possible to have consecutive time slots with differing modulation. When the device is not transmitting, the power amplifier (PA) used to supply the final transmitted signal to the antenna is usually turned off to save power. The best overall efficiency is obtained by using a switched mode power supply to provide the supply voltage for the PA. Further, it may be desirable to set the regulated power supply to a low level or 0 when the PA is not in use.

In consequence, the switched mode power supply for the PA must supply a rapidly-changing load current at constant output voltage. The rate at which the RF power, and therefore the load current, increases during the beginning of the burst is set by the requirement that the transmitted power be very low outside the desired channel. An excessively rapid increase in output power results in radiated signals outside the desired band, due to the well-known property of Fourier transforms that rapid changes in the time domain correspond to wide bandwidth in the frequency domain.

Figure 2:
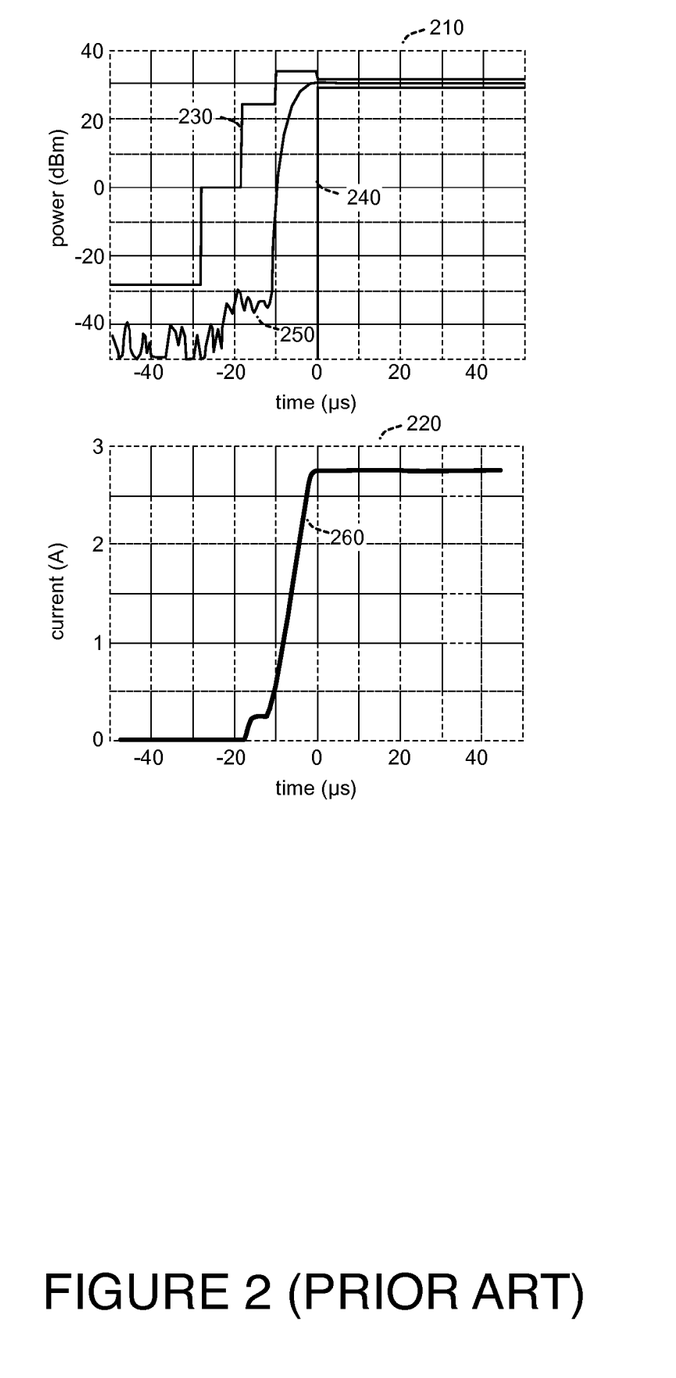
FIG. 2 shows time lines of output power and current provided to an exemplary power amplifier before the start of a transmission burst.

FIG. 2 provides time lines that summarize typical control of an output ramp of a power amplifier. The graph 210 represents an example of output power versus time 250 near the slot boundary, taken to be at 0 microseconds. Also shown are limits on the allowed output power within specific time windows around the slot edge, 230 and 240, as prescribed in the relevant GSM standards. The graph 220 depicts the corresponding changes in current drawn by the power amplifier as a function of time, 260. About 15 microseconds before the beginning of the transmission slot, the PA is enabled and the voltage of the regulated supply is brought to the desired value (if it was lowered after the previous transmission). At about 13 microseconds before the slot edge, the RF power 250 is turned on and set temporarily at a low level. The power is then ramped up smoothly over a period of about 10 microseconds, after which the modulated transmission begins. A similar ramp is used to reduce the output power at the end of the slot. The current 260, depicted in a linear scale, rises rapidly over the corresponding times. The final power is fixed to within ±1 dB.

The current required by the power amplifier may change substantially depending on the load presented at the antenna. For example, a typical power amplifier designed for 2 Watts transmitted average power may require 1200-1600 mA supply current at 3.3 V when the antenna is well-matched. However, when a 10:1 mismatch occurs (as may result, e.g., when a user's hand is placed over the antenna), the current may increase to as much as 2700 mA. These excursions must be supported, but are relatively rare. An output inductor $L_{out}$ large enough to supply the maximum current without encountering saturation of the magnetic core would be substantially larger and more expensive than required for normal operation.

Various approaches to the problem of supporting load transients in a switched DC-DC converter have been reported. In one approach, an auxiliary switched converter, for example using a smaller output inductor for faster response, is placed parallel with the main converter. A second switched converter requires additional switches and an additional output inductor, the latter being large enough to support the required saturation current, and thus does not provide the desired reduction in size relative to a high-saturation-current main output inductor. In another approach, a transistor or linear regulator drives the output node of the converter. It is necessary to ensure that the linear regulator controller and the switching converter controller do not interact in an undesired fashion, leading to oscillations and instability. Control approaches include adjustment of the switched converter current to drive the linear regulator current to 0, which is obviously unsuitable for solving the problem discussed above, since then the switched converter would eventually provide all the output current, and require a large output inductor. The linear and switched regulators may be used alternately, with one active only when the other is inactive. Obviously not helpful for reducing maximum switched current. Alternatively, conventional controls can be used for both the switched converter and linear regulator, but with the target voltage for the linear regulator set lower than that of the switched converter. Since the linear regulator can only pull the output voltage up, this results in a graceful transition between linear and switched converter control. However, this approach does not allow a constant-output-voltage operation with sustained controlled current sharing between the linear regulator or bypass FET and the switched converter.

It is desirable to have methods, apparatuses, and systems for providing additional current to the load of a switching regulator, without requiring switches and an output inductor be sized to support the maximum current that might be required.

SUMMARY

An embodiment includes a method of assisting a load current of a switching voltage regulator. The method includes generating, by a switching controller, a switching voltage through controlled closing and opening of a series switch element and a shunt switch element, and generating an output voltage by filtering the switching voltage with an output inductor and a load capacitor. The method further includes generating an assisting current based on a value of current conducted through the output inductor, and assisting the load current by summing the assisting current with the inductor current.

Another embodiment includes a switching voltage regulator. The switching regulator includes a switching controller operative to generate a switching voltage through controlled closing and opening of a series switch element and a shunt switch element, thereby generating an output voltage by filtering the switching voltage with an output inductor and a load capacitor. The switching regulator further includes an assisting current source operate to generate an assisting current based on a value of current conducted through the output inductor, wherein the assisting current is delivered to an output node of the switching voltage regulator.

Another embodiment includes a switching voltage regulator of a mobile device. The switching voltage regulator includes a switching controller operative to generate a switching voltage through controlled closing and opening of a series switch element and a shunt switch element, thereby generating an output voltage by filtering the switching voltage with an output inductor and a load capacitor. An assisting current source operative is to generate an assisting current based on a value of current conducted through the output inductor, wherein the assisting current is delivered to an output node of the switching voltage regulator. The mobile device includes a power amplifier, wherein the power amplifier is powered by the output voltage and the load current.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide examples of implementations of voltage regulators that are capable of providing a maximum sustained current $I_1$ without undue diminution of an output inductance or undesired heating of switches of the voltage regulator. The embodiments include a current detection means that produces a first signal when the switched converter current (current conducted through the output inductance) reaches a value $I_1$ (first threshold), and a second signal when the switched converter current reaches a higher value $I_2$ (second threshold) and a bypass transistor connected between the input voltage and the load. The bypass transistor is controlled by a slow control loop (sustained current) responding to the first current detection signal, and a fast fixed-time fixed-current signal (time-limited current) responding to the second current detection signal.

Figure 3:
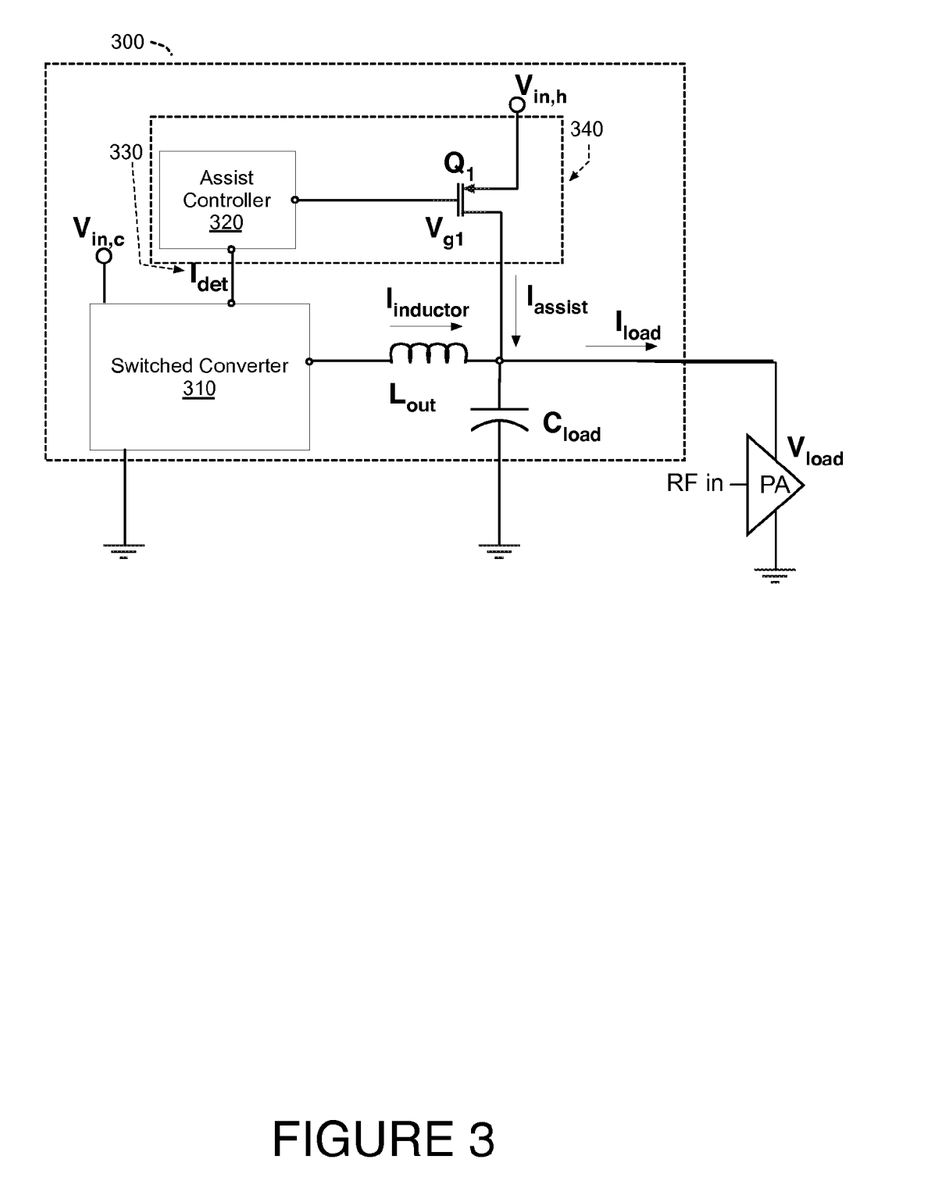
FIG. 3 shows switching voltage regulator that includes an assist controller for assisting a load current, according to an embodiment.

FIG. 3 shows switching voltage regulator 300 that includes an assist controller (Handoff Control) 320 for assisting a load current, according to an embodiment. As shown, a switching converter 310 is operative to generate a switching voltage through controlled closing and opening of a series switch element and a shunt switch element, thereby generating an output voltage by filtering the switching voltage with an output inductor ($L_{out}$) and a load capacitor ($C_{load}$). An assisting current source 340 generates an assisting current ($I_{assist}$) based on a value of current conducted through the output inductor ($I_{inductor}$). As shown, the assisting current source 340 includes the assist controller 320 and transistor $Q_1$. A current ($I_{det}$) is provided to the assist controller 320 which provides a representation of the value of the current conducted through the output inductor ($I_{inductor}$). The load current ($I_{load}$) is assisted by summing the assisting current ($I_{assist}$) with the inductor current ($I_{inductor}$) at an output node of the switching voltage converter 300. The load current ($I_{load}$) supplies current to a load, which is shown in FIG. 3 as a power amplifier (PA).

Embodiments of the described voltage regulators (switched mode regulator) are utilized in, for example, a mobile device, to provide a regulated voltage to the power amplifier (PA) of the mobile device. As described, various communication protocols (such as, GSM) of wireless networks utilize time-division multiplexing, wherein each mobile device connected to the wireless network is allocated one or more time slots, during which it is the only mobile device transmitting on a given channel. The described embodiments maintain control (operation) of Q1 (also referred to as a bypass FET) throughout the duration of the time slots, thereby maintaining the current of the output inductor ($I_{inductor}$) below the desired maximum value throughout the slot.

For an embodiment, the assisting current ($I_{assist}$) includes a sustained current and a time-limited current. For the discussion here, the term "handoff burst controller" represents functionality of the time-limited current controller, and the term "handoff controller" represents the functionality of the sustained current controller. The functionality of both is included within the assist control 320.

For at least some embodiments, generating the sustained assisting current based on the value of current ($I_{inductor}$) conducted through the output inductor includes detecting if the value of the current ($I_{inductor}$) conducted through the output inductor exceeds a first threshold, and generating the sustained assisting current based on how much the value of the current ($I_{inductor}$) conducted through the output inductor exceeds the first threshold. For an embodiment, a value of the first threshold is selected to ensure that the current conducted through the output inductor ($L_{out}$) does not exceed a predetermined saturation limit.

For at least some embodiments, generating the time-limited assisting current based on the value of current conducted through the output inductor includes detecting if the value of the current conducted through the output inductor exceeds a second threshold, and generating the time-limited assisting current based on a pre-set maximum current level.

For an embodiment, the time limited assisting current is applied for a time period $t_{HOA}$, wherein the time period $t_{HOA}$ is selected based upon known properties of a load transient (that is, for example, a load transient of the power amplifier (PA)). As is shown and described, at least some embodiments further include passing control of a gate voltage of a bypass FET (shown as Q1) within an assist current source from the handoff assist burst controller to the handoff assist controller, after the time period $t_{HOA}$, wherein the assist current source generates the assisting current, the handoff assist controller generates the sustained assist current, and the handoff assist burst controller generates the time-limited assisting current. For at least some embodiments, the gate voltage of the bypass FET is set using a common storage capacitor, wherein the common storage capacitor sets the gate voltage of the bypass FET gate voltage for both the handoff assist controller and the handoff burst controller.

For at least some embodiments, a value of the second threshold is selected to ensure that the current conducted through the output inductor does not exceed a maximum allowable current for the switching voltage regulator.

Figure 4:
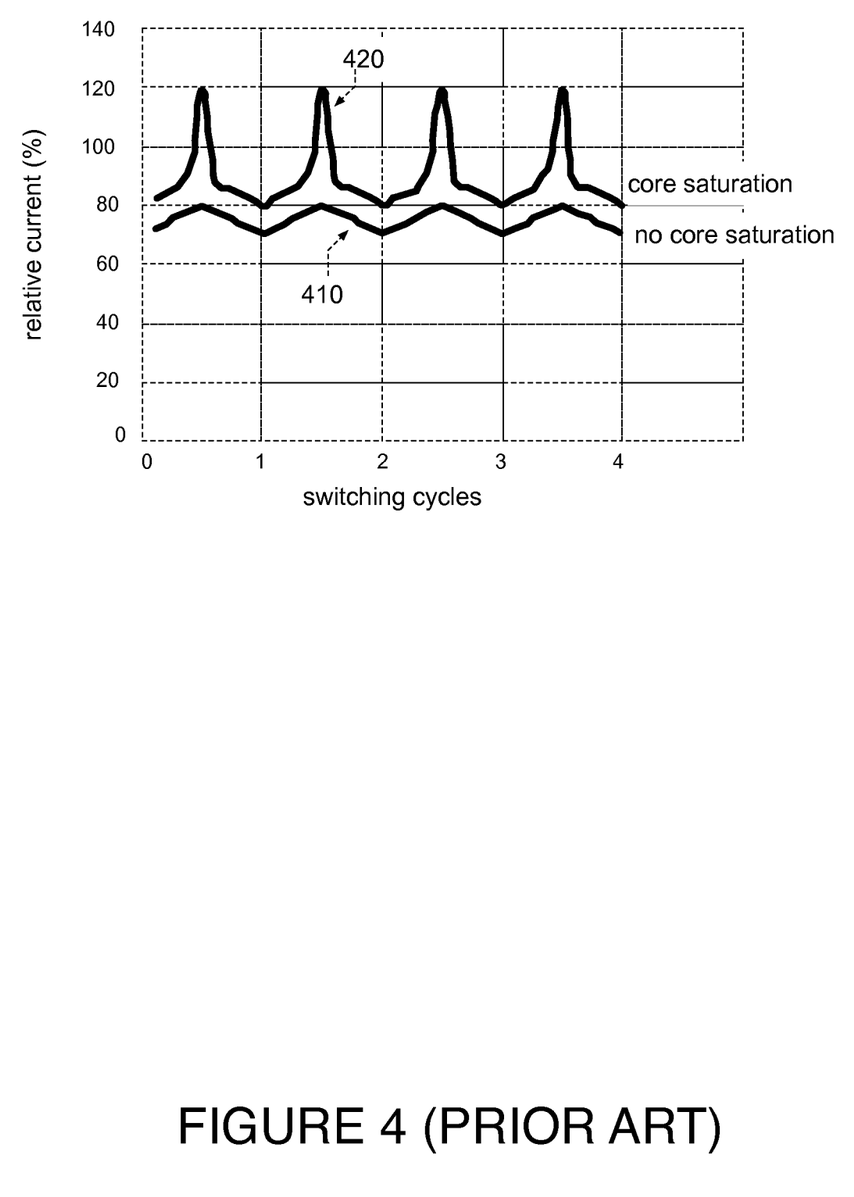
FIG. 4 is a graph that shows an example of instantaneous current versus time (switching cycles) for an output inductor near its saturation limit.

FIG. 4 is a graph that shows an example of instantaneous current versus time (switching cycles) for an output inductor near its saturation limit. The graph 410 shows instantaneous inductor current vs. time (measured in switching cycles), for the case where the current does not exceed the saturation threshold. The graph 420 depicts the same quantity when the current exceeds the saturation threshold. A small increase in current flowing through the inductor leads to dramatic reduction in inductance, and thus to a dramatic increase in instantaneous current for a given applied voltage. The presence of inductor saturation increases current ripple, and may be expected to increase voltage ripple and spurious output from the power amplifier, though the precise effects depend on the details of the implementation. If the maximum current is limited to below the value at which saturation artifacts appear, these undesirable results may be avoided. Note that the saturation threshold is an instantaneous phenomenon, depending both on the DC current level and the ripple (the change in inductor current during a single switching cycle). If the signal ($I_{det}$) 330 is based on the average current over a switching cycle, then it is also necessary to account for the expected current ripple to estimate the appropriate saturation threshold and thus the value of $I_1$. Additional or alternative considerations may also be used to determine the value of $I_1$.

The switching voltage regulator 300 supplies current to a load, here shown as a power amplifier (PA), through an inductor $L_{OUT}$. Any buck converter may be used, but an embodiment uses a high-frequency switching converter capable of increasing output current fast enough to track the desired ramp current of the load up to a first threshold current $I_1$. The capacitor $C_{load}$ filters the output signal to remove ripple due to the variations in switching current, and to supply charge to the load during brief transient changes in output current. The transistor $Q_1$ is connected between an input voltage $V_{in,h}$, which must be at least as large as the largest anticipated load voltage plus an allowance for the voltage across the transistor, and the load. $Q_1$ is depicted as a PMOS transistor, but any device that can be used as a controllable current source may be employed. The gate voltage of $Q_1$ is provided by a controller 320, that receives one or more signals 330 from the switched converter, which serve to indicate the average value of the inductor current $I_{inductor}$.

The assist control 320 uses the input signals 330 to set the gate voltage $V_{g1}$ of transistor $Q_1$. The signal or signals 330 are used to determine that the switched converter current $I_{inductor}$ is greater than the first threshold $I_1$. The degree to which the inductor current exceeds the threshold is integrated to cause the gate voltage $V_{g1}$ to decrease, turning $Q_1$ on. The gate voltage continues to fall as long as $I_{inductor}$ is greater than the first threshold. Therefore, when steady state is reached, the switched converter current has returned to the desired maximum value, while the excess current flows through $Q_1$. The time constant for the integrator is chosen to be tong compared to the response time of the switched converter, to avoid undesirable coupling and instability.

In some prior art implementations in which assist current is provided by a linear regulator, the switching voltage regulator is adjusted to drive the linear (or assist) current to 0 on average. In other prior-art implementations, under-voltage or over-voltage conditions are avoided. Control approaches that include adjustment of the switched converter current to drive the linear regulator current to 0 are obviously unsuitable for the present requirement, since then the switched converter would eventually provide all the output current, and therefore, require a large output inductor. Control approaches based on under- or over-voltage conditions respond to the practical current limit of the switched converter, rather than to the maximum desired sustained current. If an under-voltage controller were used, to maintain regulation of ±3% of 2 V, the controller must respond to an under-voltage of 60 mV. If a hysteretic controller were employed, it would be difficult to avoid relaxation oscillations in the output voltage. If a linear controller were used, high gain would be needed to ensure close voltage regulation, and thus stability in the presence of the high-gain switched voltage regulator controller would be difficult to obtain.

If the current ramp is slow enough to be compensated by the first threshold control mechanism described above, no further provisions are needed to ensure that the inductor current remains below the point at which saturation is a problem. However, in realistic implementations this condition may not be satisfied. For example, referring to FIG. 2, it can be seen that in a GSM/EDGE application, the load current ramps from essentially zero to its maximum value less than 10 microseconds. Even if a fairly fast converter is employed, using a switching frequency of e.g. $f_{sw}$=8 MHz, the switching converter control bandwidth is on the order of $f_{sw}/10$ to $f_{sw}/20 \approx 400$ to 800 kHz, corresponding to a response time of 1.2 to 2.5 microseconds. To ensure minimal coupling, the handoff response should be no more than $\frac{1}{10}$ as fast as the switched converter, so its response time will be on the order of 12 to 25 microseconds. Thus, in order to ensure stable control, the handoff response must be too slow to compensate for the load ramp. The switched converter current exceeds the stated maximum by a substantial amount for a relatively long period until the handoff transistor catches up.

To avoid this undesirable condition, a second inductor current threshold $I_2$ is used to indicate that the switched converter current has exceeded the desired sustained level by a substantial amount. For an embodiment, generating the time-limited assisting current based on the value of current conducted through the output inductor includes detecting if the value of the current conducted through the output inductor exceeds the second threshold, and generating the time-limited assisting current based on a pre-set maximum current level for a given load behavior. For embodiments, the second threshold is greater than the first threshold.

For at least some embodiments, the second threshold $I_2$ may be chosen to be 20% to 30% larger than the first threshold $I_1$. When signals 330 indicate that the inductor current has exceeded the second threshold, the assist controller implements a second behavior, the handoff assist burst. The handoff assist burst quickly drops the gate voltage $V_{g1}$ to produce a predetermined current through $Q_1$, large enough to ensure that the switched current does not exceed the saturation limit, or other predefined limits. The handoff assist burst may be turned on rapidly (in a time comparable to the switching period of the switching converter) if the closed-loop output impedance of the switching converter, multiplied by the spectral components of the pulse, produces sufficiently small spectral disturbances to be acceptable in the application of interest. If the output spectrum of an abrupt burst is not acceptable in a given application, the burst may be turned on more slowly, through the use of a ramped reference current or other techniques known in the art, as long as the turn-on is still rapid compared to the time required for the load current to ramp. The handoff assist burst should remain on for a fixed time comparable to the maximum time required for the load current to complete ramping to its maximum value. Once the burst is terminated, control of the gate voltage is returned to the integrated response to the first threshold signal. The use of a fixed current and fixed time avoids interactions between the fast switched converter controller and the fast handoff assist burst controller, which would otherwise lead to instabilities.

Figure 5:
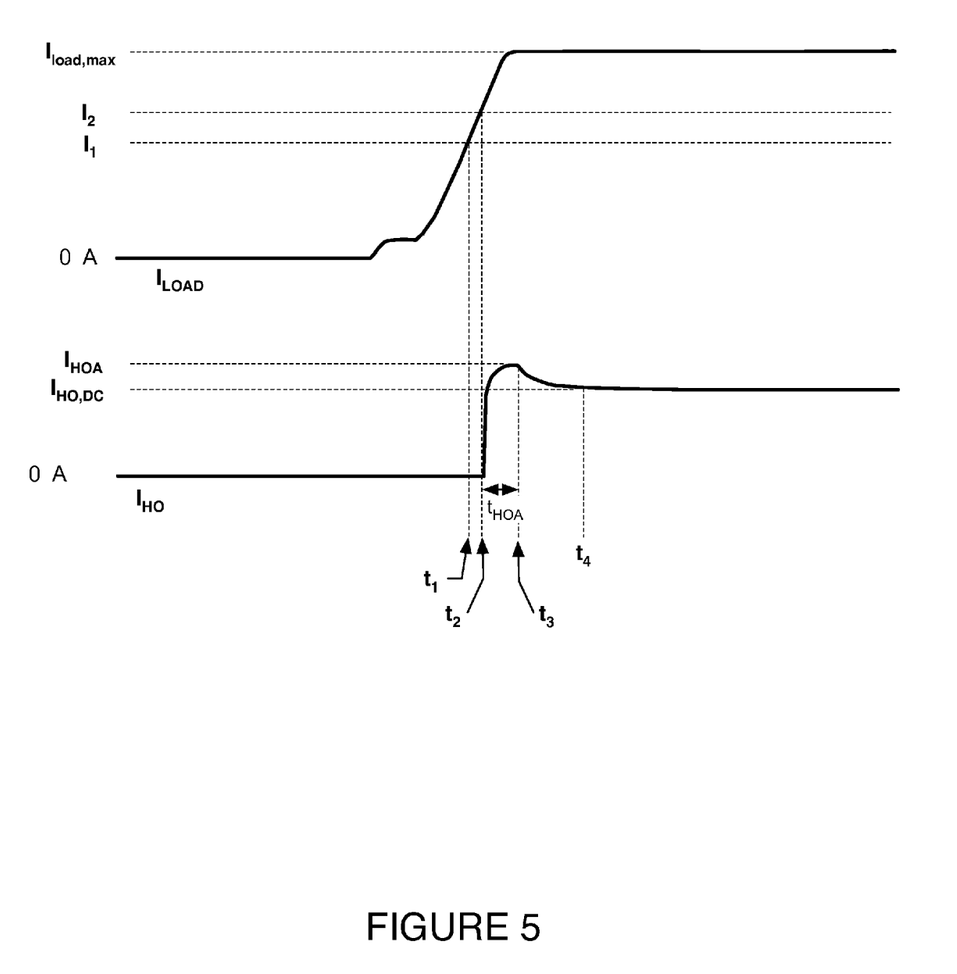
FIG. 5 shows time lines of a load current and an assisting current of the switching voltage regulator of FIG. 3, according to an embodiment.

FIG. 5 shows time lines of a load current and an assisting current of the switching voltage regulator of FIG. 3, according to an embodiment. FIG. 5 shows the load current $I_{load}$ and the current through the transistor $Q_1$, $I_{HO}$, during a typical upward ramp. The two currents are displayed on a common time axis, but offset vertically for clarity.

The load current starts at 0. After a brief pedestal period at a modest current, typically encountered in the operation of a GSM/EDGE power amplifier, the load current rapidly increases to a value substantially larger than the thresholds $I_1$ and $I_2$. When the load current reaches the first threshold $I_1$ at time $t_1$, the handoff controller begins to decrease the gate voltage $V_{g1}$. During this time, the load current continues to increase rapidly, reaching the second threshold value $I_2$ at time $t_2$, before the gate voltage $V_{g1}$ has fallen below the threshold voltage of transistor $Q_1$. The handoff assist burst controller rapidly drops $V_{g1}$ to allow a fixed current $I_{HOA}$ to flow through $Q_1$ for a fixed time $t_{HOA}$. During this time, the current from the switched converter $I_{inductor}$ falls rapidly as it is replaced by $I_{HOA}$, and then rises as the load ramp continues. At time $t_3$, the handoff assist burst is terminated, and control of the gate voltage $V_{g1}$ is returned to the integrator, which slowly reduces the current through transistor $Q_1$ to that required to achieve the desired threshold behavior. By the handoff response time $t_4$, the desired steady state condition $I_{inductor}=I_1$ has been achieved, and in consequence $I_{HO,DC}=(I_{load,max}-I_1)$.

It should be noted that, when the input voltage $V_{in,h}$ is substantially greater than the output voltage $V_{load}$, the efficiency of the overall voltage supply 300 is reduced relative to that of the switched converter 310 alone. The power dissipated in the transistor $Q_1$ is $$P_{Q1}=I_{Q1}(V_{in,h}-V_{load})$$

and the power delivered to the load is $$P_{load,Q1}=I_{Q1}V_{load}$$

so the efficiency of the current path through the transistor $Q_1$ is $$\eta = \frac{I_{Q1}V_{load}}{I_{Q1}(V_{in,h} - V_{load}) + I_{Q1}V_{load}} = \frac{I_{Q1}V_{load}}{I_{Q1}V_{in,h}} = \frac{V_{load}}{V_{in,h}}$$

For example, if the input voltage is 4.2 V and the load voltage is 3 V, the handoff efficiency is 71%. The switched converter efficiency under these conditions will typically be 80% to 90%, or higher. Therefore, there is a tradeoff between the cost and size of the switched converter and output inductor $L_{out}$, and the handoff transistor $Q_1$ and current thresholds $I_1$ and $I_2$. These values must be chosen based on the expected distribution of maximum load current over varying conditions of use, to ensure that optimal efficiency is provided under common operating conditions, while supporting rare maxima in load current without excessive component size or cost.

Figure 6:
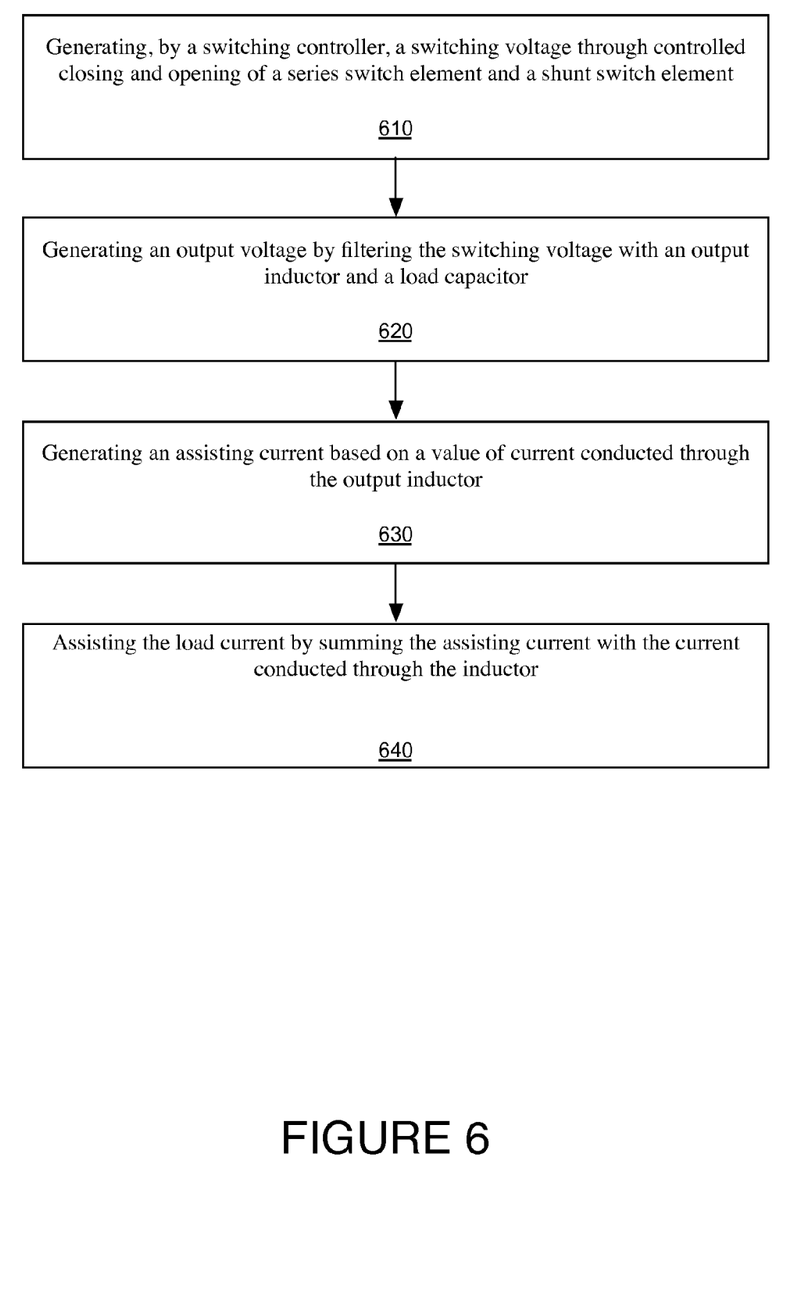
FIG. 6 is a flow chart that includes steps of a method of assisting a load current of a switching voltage regulator, according to an embodiment.

FIG. 6 is a flow chart that includes steps of a method of assisting a load current of a switching voltage regulator, according to an embodiment. A first step 610 includes generating, by a switching controller, a switching voltage through controlled closing and opening of a series switch element and a shunt switch element. A second step 620 includes generating an output voltage by filtering the switching voltage with an output inductor and a load capacitor. A third step 630 includes generating an assisting current based on a value of current conducted through the output inductor. A fourth step 640 includes assisting the load current by summing the assisting current with the current conducted through the inductor. As described, at least some embodiments of the assisting current include a sustained assisting current and a time-limited assisting current.

For an embodiment, generating the sustained assisting current based on the value of current conducted through the output inductor includes detecting if the value of the current conducted through the output inductor exceeds a first threshold, and generating the sustained assisting current based on how much the value of the current conducted through the output inductor exceeds the first threshold. For an embodiment, a value of the first threshold is selected to ensure that the current conducted through the output inductor does not exceed a predetermined saturation limit. For a specific embodiment generating the sustained assisting current is based upon an integral (shown, for example, in FIG. 7 by the $R_1$-$C_1$ integration node) of how much the value of the current conducted through the output inductor exceeds the first threshold.

For an embodiment, generating the time-limited assisting current based on the value of current conducted through the output inductor includes detecting if the value of the current conducted through the output inductor exceeds a second threshold, and generating the time-limited assisting current based on a pre-set maximum current level. For an embodiment, the second threshold is greater than the first threshold. For an embodiment, a value of the second threshold is selected to ensure that the current conducted through the output inductor does not exceed a maximum allowable current for the switching voltage regulator.

The four parameters, the first threshold value $I_1$, the second threshold value $I_2$, the burst current value $I_{HOA}$, and the time delay $t_{HOA}$, are dependent on the requirements of a particular application.

Increasing the first threshold $I_1$ produces increased current ripple in the inductor, and higher peak currents in the converter. Decreasing the first threshold reduces ripple and peak current, but impacts efficiency, as noted above. When the difference between the input and output voltages is large, the power dissipated in the transistor $Q_1$ gives rise to localized heating, which may impact reliability. Therefore, for an embodiment, $I_1$ is selected to the largest value that still produces acceptable ripple current and peak current.

For an embodiment, the second threshold $I_2$ is selected to ensure that the converter output current does not exceed the rated limit of the converter during the load current ramp. The rated limit of the converter may be set by a number of operational or reliability considerations. $I_2$ may be scaled from $I_1$, as described above, but in an alternate embodiment it may be set independently of $I_1$, subject to the constraint that $I_1 < I_2$.

When the burst current $I_{HOA}$ is turned on, if the result is a sudden increase in output current, the sudden change in output current leads to a disturbance in the output voltage. In most applications a sufficiently small disturbance is acceptable, but a large disturbance will have unwanted consequences. For example, in an embodiment in which the load is an RF power amplifier, a disturbance in the voltage delivered to the amplifier may cause spurious output (transmission at frequencies outside the intended band), or changes in the transmitted signal constellation leading to an increased probability of erroneous demodulation (bit error). Thus, the burst current must be small enough to avoid an output disturbance which leads to violation of specified limits for spurious output and bit error rate. If the burst current is too small, the converter current may transiently exceed the inductor saturation current, leading to excess output ripple during the load current ramp. High converter current may cause the converter to enter into a current-limiting mode in which it acts as a current regulator rather than a voltage regulator, resulting in a disturbance in the output voltage. High converter current may also impact long-term reliability. Thus, the burst current $I_{HOA}$ is chosen within the range of values where output disturbances are sufficiently small, while the converter current will remain below the maximum value during the load transient. In an alternative embodiment, the transient current $I_{HOA}$ may be ramped, so that it is possible to keep a relatively small output voltage disturbance, while still reaching a high absolute value for the assist current $I_{HOA}$.

The time delay $t_{HOA}$ is chosen to ensure that the load transient is completed when the assist transient burst ends. If the time is too short, the relatively slow handoff controller will be unable to follow the changes in the load current, resulting in overshoot of the desired sustained assist current. If the time is too long, efficiency is impaired.

Figure 7:
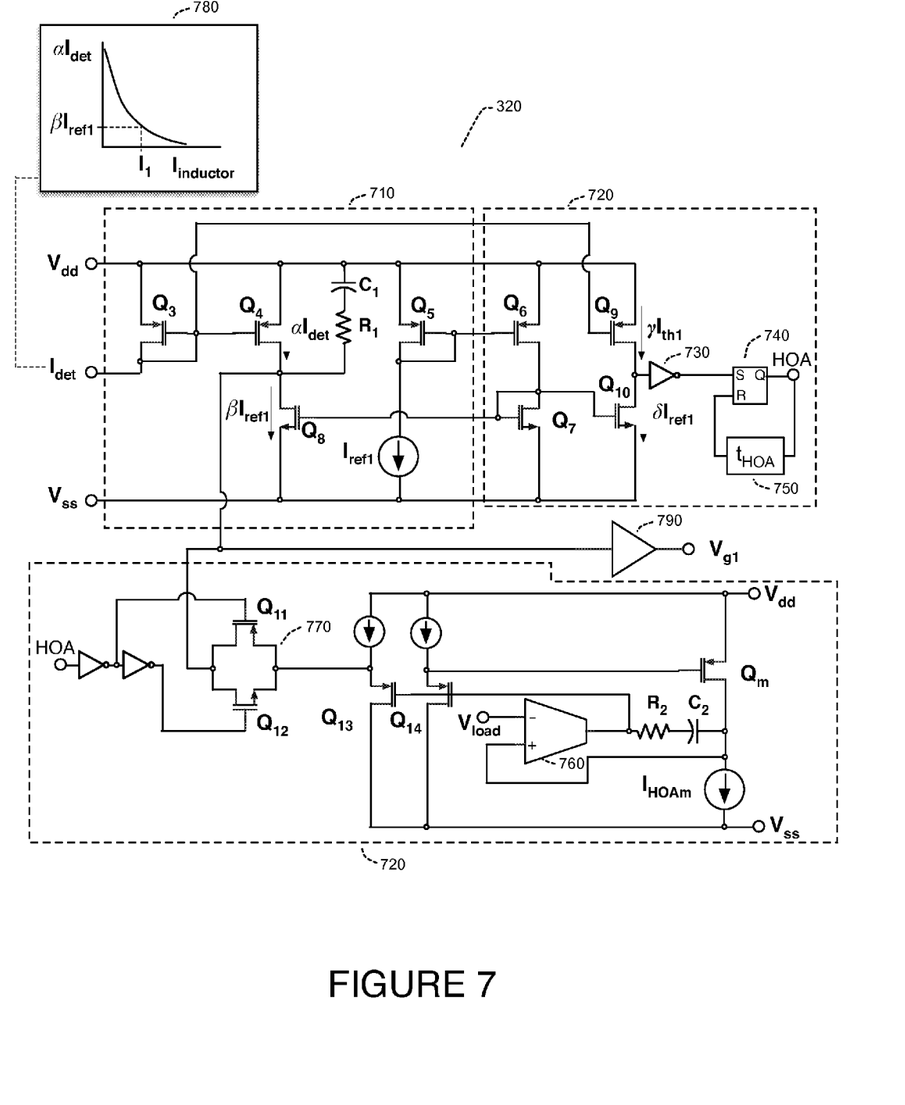
FIG. 7 shows a schematic of circuitry for implementing a load assisted, switching voltage regulator, according to an embodiment.

FIG. 7 shows a schematic of circuitry for implementing a load assisted, switching voltage regulator, according to an embodiment. The assist controller 320 consists of a handoff controller 710 and a handoff assist burst controller 720. In this example, it is presumed that the signal indicating the average inductor current, 330, is itself provided as a current, a common procedure to minimize the effects of high-frequency noise present within the analog circuitry due to abrupt changes in the state of the switching transistors within the converter. However, a voltage signal, or a digital signal, could also be used. The controller shown is designed assuming that the signal $I_{det}$ has the behavior shown in the inset 780: that is, the detected current decreases as the current provided by the switched converter to the inductor increases. The embodiments shown and described can be readily modified to support a different control input, such as a current that increases with increasing inductor current, or a voltage signal proportional to the inductor current. It will be appreciated that the detected current is presumed to be averaged over at least one switching cycle to remove the ripple current component normally present in the output inductor of a switching converter. The current ripple must be accounted for in estimating the value of the first threshold $I_1$ from the known properties of the inductor $L_{out}$.

The operation of the handoff controller 710 is first explained. The detected current $I_{det}$ is extracted from the drain of diode-connected PMOS transistor $Q_3$, and the same current is proportionally mirrored to transistor $Q_4$. A fixed reference current $I_{refl}$ is extracted from the drain of diode-connected PMOS transistor $Q_5$ and mirrored to proportionally mirrored to transistor $Q_6$. This current flows through diode-connected NMOS transistor $Q_7$, and is proportionally mirrored to $Q_6$. The current flowing into the $R_1$-$C_1$ integration node is thus the difference between the scaled detector current $\alpha I_{det}$ and the scaled reference $\beta I_{refl}$, where the coefficients $\alpha$ and $\beta$ depend on the relative sizes of the various mirror transistors, and may be adjusted as needed to optimize circuit size and performance, consistent with the requirement that the difference in the scaled currents is 0 when the average inductor current $I_{inductor}$ is equal to the first threshold $I_1$, as shown in inset 780. Note that the reference current may be generated within the handoff controller, or may be received from the switched converter, and that the absolute magnitude of the reference current my vary depending on operating conditions, so long the relationship between the detected and reference currents at the threshold inductor current $I_1$ is maintained.

The voltage in the integration node $R_1$-$C_1$, referenced to the supply rail $V_{dd}$, is supplied to the handoff transistor gate $V_{g1}$ by way of buffer amplifier 790. Capacitor $C_1$ charges up or down, thereby adjusting the conductance of transistor $Q_1$, until the average inductor current is equal to the first threshold $I_1$.

The absolute magnitude of the scaled currents is set to charge the capacitor $C_1$ at the desired slow rate, to ensure stability of the overall controller. The scaling factor $\alpha$, capacitor size, and current detection sensitivity should be chosen so that the charging time is substantially longer than the response time of the switched converter 310, to minimize the likelihood of undesired oscillations or instabilities.

Handoff assist burst controller 720 also drives buffer 790, to provide rapid response when the load current ramps up during the initial portion of a transmission, as described previously. The same detector current and reference current used in controller 710 are employed, but with differing scalings such that currents $\gamma I_{det}$ and $\delta I_{refl}$ flow in transistors $Q_9$ and $Q_{10}$, respectively. The scaling coefficients are chosen so that $\gamma I_{det}$ and $\delta I_{refl}$ are equal when the average inductor current is equal to the second threshold $I_2$. Since no intentional capacitance is added to the input of inverter 730, the input will be rapidly driven to a voltage near the negative rail $V_{ss}$ when the scaled detected current $\gamma I_{det}$ is less than $\delta I_{refl}$, signifying that the average inductor current has exceeded the second threshold. The output of inverter 730 thus goes high, causing the output of latch 740 to go high. This signal HOA is supplied to a time delay $t_{HOA}$ (750), after which the latch 740 is reset. Thus, the handoff assist burst is applied for a fixed time once the inductor current has exceeded the second threshold. This fixed time must be established based on the known properties of the load in the envisioned application. It is implicitly assumed in this embodiment that the load current ramp is substantially monotonic on the time scales of interest, as depicted in FIG. 2.

The signal also acts to turn on the pass gate 770, consisting of transistors $Q_{11}$ and $Q_{12}$. The input to the pass gate is the output of the source follower $Q_{13}$. The source follower is sized to ensure that, when pass gate 770 is open, the gate of $Q_1$ is rapidly forced to the desired voltage. Matched source follower $Q_{14}$ provides essentially the same voltage to the gate of replica transistor $Q_m$, which is a scaled version of $Q_1$. The current source $I_{HOAm}$ sets the current flowing through the mirror transistor. By adjusting the magnitude of this current source, the peak current in the handoff assist burst $I_{HOA}$ can be adapted to ensure the desired performance of the system during a load current ramp. The operational transconductance amplifier 760, together with transistors $Q_{14}$ and $Q_m$, form an operational amplifier compensated with fitter $R_2$-$C_2$, that ensures that the drain voltage on the replica transistor is equal to the voltage on the load, so that the replica transistor sees the same voltage conditions as transistor $Q_1$, in the case where the positive supply $V_{dd}$ is close to the input voltage $V_{in,h}$ seen by the source of $Q_1$. In an alternative embodiment, the source of $Q_m$ may be connected to the source of $Q_1$, or the voltage on the source of $Q_m$ may be set equal to that on $Q_1$ by means of a similar transconductance amplifier arrangement to that used to set the drain voltage, or any equivalent means.

Once the time delay $t_{HOA}$ has expired, latch 740 is reset, causing signal HOA to go low. Pass gate 770 turns off, and control of the input to the buffer 790 is returned to handoff controller 710. Capacitor $C_1$, which will have followed the voltage applied during the handoff assist burst, will then slowly recover towards the value required to drive the inductor current to the first threshold $I_1$. Because $C_1$ is always connected to the input of buffer 790 even when the handoff assist burst controller controls the voltage thereon, no sudden change in gate voltage occurs when the handoff assist burst controller releases control of the buffer input by turning pass gate 770 off.

As previously stated, for an embodiment, the time limited assisting current is delivered to the output node of the switching voltage regulator for a time period $t_{HOA}$, wherein the time period $t_{HOA}$ is selected based upon known properties of a load transient. Further, at least some embodiments include a bypass FET, wherein the control of a gate voltage of the bypass FET gate voltage within the assisting current source is passed from handoff assist burst controller to a handoff assist controller, after the time period $t_{HOA}$, without a discontinuity in the gate voltage, wherein avoidance of a discontinuity is accomplished by using a common storage capacitor (C1) to set the gate voltage of the bypass FET for both the handoff assist controller and the handoff burst controller.

A switching converter in which the maximum input voltage exceeds the rated voltage for the switching transistors employed can be constructed by using a cascode configuration to protect the switching transistors from excessive voltages, as described for example in copending application Ser. No. 12/646,213. In such a configuration, it is likely that the bypass transistor if fabricated on the same integrated circuit as the switching converter 310, would be configured as a cascode combination of a switching and protection device. In that case, the voltage to be placed on the drain of the mirror transistor $Q_m$ is the voltage at the node between the switching device and the protection device, rather than the output voltage $V_{load}$.

In an alternative embodiment, the burst controller may respond when the rate of change of the inductor current, $dI_{inductor}/dt$, exceeds a fixed threshold value, rather than when the absolute current exceeds a threshold $I_2$ as previously described. In an embodiment, the signal 330 may be a current or a voltage, and may be either proportional to the average inductor current, inversely proportional to the average inductor current, or may depend on the instantaneous peak inductor current during the switching cycle. In an embodiment, the threshold $I_2$ and/or the current $I_{HOA}$ may be adjusted depending on the value of the input voltage $V_{in}$, or conversion ratio ($V_{out}/V_{in}$), to use the least assist current needed to avoid a saturated duty cycle condition. In an embodiment, thresholds $I_1$ and $I_2$ may be adjusted based on the measured inductor current ripple, or based on the computed current ripple obtained from measured values of $V_{out}$ and $V_{in}$, for example by using the formula:

$$I_{RIPPLE} \approx \frac{V_{out}(1 - V_{out}/V_{in})}{f_{SW} L_{out}}$$

Although specific embodiments have been described and illustrated, the embodiments are not to be limited to the specific forms or arrangements of parts so described and illustrated.

What is claimed:
1. A method of assisting a load current of a switching voltage regulator, comprising:
generating, by a switching controller, a switching voltage through controlled closing and opening of a series switch element and a shunt switch element;
generating an output voltage at an output node of the switching voltage regulator by filtering the switching voltage with an output inductor and a load capacitor;
assist the load current by summing an assisting current of an assisting assisting transistor with a current conducted through the output inductor at the output node of the switching voltage regulator;
control a gate voltage of the assisting transistor with a handoff controller;
detecting a value of the current conducted through the output inductor; determining whether the value of the current conducted through the output inductor exceeds a threshold value;
transfer control of the gate voltage of the assisting transistor from the handoff controller to a current mirror within a handoff assist burst controller after determining the current conducted through the output inductor exceeds the threshold value;
start a time period $t_{HOA}$ of a time delay circuit after determining the current conducted through the output inductor exceeds the threshold value;
transferring control of the gate voltage of the assisting transistor from the current mirror within the handoff assist burst controller to the handoff controller after the time period $t_{HOA}$ of the time delay circuit expires, wherein the time period $t_{HOA}$ is selected to ensure that a load transient is completed when an assist transient burst ends; and
a power amplifier, wherein the power amplifier is powered by the output voltage and the load current.

2. The method of claim 1, wherein the assisting current further comprises a sustained assisting current, comprising:
detecting if the value of the current conducted through the output inductor exceeds a first threshold; and
generating the sustained assisting current based on how much the value of the current conducted through the output inductor exceeds the first threshold.

3. The method of claim 2, wherein generating the sustained assisting current is based upon an integral of how much the value of the current conducted through the output inductor exceeds the first threshold.

4. The method of claim 2, wherein a value of the first threshold is selected to ensure that the current conducted through the output inductor does not exceed a predetermined saturation limit.

5. The method of claim 1, wherein the assisting current comprises a sustained assisting current and a time-limited assisting current, wherein the handoff assist controller generates the sustained assisting current, and the handoff assist burst controller generates the time-limited assisting current.

6. The method of claim 5, further comprising setting the gate voltage of the assisting transistor using a common storage capacitor, wherein the common storage capacitor sets the gate voltage of the assisting transistor gate voltage for both the handoff assist controller and the handoff burst controller.

7. The method of claim 1, wherein a value of the threshold is selected to ensure that the current conducted through the output inductor does not exceed a maximum allowable current for the switching voltage regulator.

8. A switching voltage regulator, comprising: a switching controller operative to generate a switching voltage through controlled closing and opening of a series switch element and a shunt switch element, thereby generating an output voltage at an output node of the switching voltage regulator by filtering the switching voltage with an output inductor and a load capacitor;
an assisting current source operative to:
assist a load current by summing an assisting current of an assisting transistor with a current conducted through the output inductor at the output node of the switching voltage regulator;
control a gate voltage of the assisting transistor with a handoff controller;
detect a value of the current conducted through the output inductor;
determine whether the value of the current conducted through the output inductor exceeds a threshold value;
transfer control of the gate voltage of the assisting transistor from the handoff controller to a current mirror within a handoff assist burst controller after determining the current conducted through the output inductor exceeds the threshold value;
start a time period $t_{HOA}$ of a time delay circuit after determining the current conducted through the output inductor exceeds the threshold value;
transfer control of the gate voltage of the assisting transistor from the current mirror within the handoff assist burst controller to the handoff controller after the time period $t_{HOA}$ of the time delay circuit expires, wherein the time period $t_{HOA}$ is selected to ensure that a load transient is completed when an assist transient burst ends.

9. The switching voltage regulator of claim 8, wherein the assisting current further comprises a sustained assisting current, and the assisting current source is further operative to generate the sustained assisting current based on how much the value of the current conducted through the output inductor exceeds a first threshold.

10. The switching voltage regulator of claim 9, wherein the sustained assisting current is generated based upon an integral of how much the value of the current conducted through the output inductor exceeds the first threshold.

11. The switching voltage regulator of claim 9, wherein a value of the first threshold is selected to ensure that the current conducted through the output inductor does not exceed a predetermined saturation limit.

12. The switching voltage regulator of claim 8, wherein a value of the threshold is selected to ensure that the current conducted through the output inductor does not exceed a maximum allowable current for the switching voltage regulator.

13. The switching voltage regulator of claim 8, wherein the control of a gate voltage of the assisting transistor within the assisting current source is passed from the handoff assist burst controller to the handoff assist controller after the time period $t_{HOA}$ without a discontinuity in the gate voltage, wherein avoidance of a discontinuity is accomplished by using a common storage capacitor to set the gate voltage of the assisting transistor for both the handoff assist controller and the handoff burst controller.

14. A switching voltage regulator of a mobile device, comprising: a switching controller operative to generate a switching voltage through controlled closing and opening of a series switch element and a shunt switch element, thereby generating an output voltage at an output node of the switching voltage regulator by filtering the switching voltage with an output inductor and a load capacitor;
an assisting current source operative to:
assist a load current by summing an assisting current of an assisting transistor with a current conducted through the output inductor at the output node of the switching voltage regulator;
control a gate voltage of the assisting transistor with a handoff controller;
detect a value of the current conducted through the output inductor;
determine whether the value of the current conducted through the output inductor exceeds a threshold value;
transfer control of the gate voltage of the assisting transistor from the handoff controller to a current mirror within a handoff assist burst controller after determining the current conducted through the output inductor exceeds the threshold value;
start a time period $t_{HOA}$ of a time delay circuit after determining the current conducted through the output inductor exceeds the threshold value;
transfer control of the gate voltage of the assisting transistor from the current mirror within the handoff assist burst controller to the handoff controller after the time period $t_{HOA}$ of the time delay circuit expires, wherein the time period $t_{HOA}$ is selected to ensure that a load transient is completed when an assist transient burst ends; and
a power amplifier, wherein the power amplifier is powered by the output voltage and the load current.

* * * * *